(12) United States Patent
Deng

(10) Patent No.: US 11,573,462 B2
(45) Date of Patent: Feb. 7, 2023

(54) MANUFACTURING METHOD OF DISPLAY PANEL AND DISPLAY PANEL

(71) Applicant: TCL CHINA STAR OPTOELECTRONICS TECHNOLOGY CO., LTD., Shenzhen (CN)

(72) Inventor: Yong Deng, Shenzhen (CN)

(73) Assignee: TCL CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 178 days.

(21) Appl. No.: 16/972,917

(22) PCT Filed: Oct. 30, 2020

(86) PCT No.: PCT/CN2020/125069
§ 371 (c)(1),
(2) Date: Dec. 7, 2020

(87) PCT Pub. No.: WO2022/047971
PCT Pub. Date: Mar. 10, 2022

(65) Prior Publication Data
US 2022/0197073 A1    Jun. 23, 2022

(30) Foreign Application Priority Data
Sep. 4, 2020    (CN) .......................... 202010919212.5

(51) Int. Cl.
*G02F 1/1343* (2006.01)
*G02F 1/1333* (2006.01)

(52) U.S. Cl.
CPC .... *G02F 1/13439* (2013.01); *G02F 1/133345* (2013.01)

(58) Field of Classification Search
None
See application file for complete search history.

(56) References Cited

U.S. PATENT DOCUMENTS

| 2015/0303123 | A1* | 10/2015 | Choi | H01L 27/1222 |
| | | | | 438/158 |
| 2018/0101057 | A1 | 4/2018 | Kim et al. | |
| 2019/0165072 | A1* | 5/2019 | Wang | H01L 27/3265 |

FOREIGN PATENT DOCUMENTS

| CN | 103185998 A | 7/2013 |
| CN | 104377167 A | 2/2015 |
| CN | 106941093 A | 7/2017 |
| CN | 107464776 A | 12/2017 |
| CN | 210271564 U | 4/2020 |

* cited by examiner

*Primary Examiner* — Ryan Crockett
(74) *Attorney, Agent, or Firm* — The Roy Gross Law Firm, LLC; Roy Gross

(57) ABSTRACT

A manufacturing method of a display panel and the display panel are provided, wherein the display panel includes a base substrate, a first metal layer, an insulation layer, an active layer, a second metal layer, and a passivation layer. The passivation layer corresponding to a bonding area further includes hole structures. Surface materials of the second metal layer corresponding to the hole structures are a third metal material. Reducing materials are introduced to make a surface of the second metal layer form the third metal material during a preparation.

20 Claims, 4 Drawing Sheets

MANUFACTURING METHOD OF DISPLAY PANEL AND DISPLAY PANEL

CROSS REFERENCE TO RELATED APPLICATIONS

This application is a National Phase Entry of PCT/CN2020/125069 filed on Oct. 30, 2020 claiming priority to Chinese application 202010919212.5 filed Sep. 4, 2020. The contents of these applications are incorporated by reference in their entirety.

BACKGROUND

Field of Invention

The present disclosure relates to the field of display technology, and more particularly, to a manufacturing method of a display panel and the display panel.

Description of the Prior Art

With a continuous development of display technology, various display devices have increasingly higher requirements for quality and performance of display panels.

Compared with traditional display panels, light-emitting diode (LED) liquid crystal display panels have properties including low power consumption, excellent image quality, and higher production yield, and have gradually dominated the display field at present. Preparation technologies such as several coatings, exposures, and developments are needed during a preparation process of the LED liquid crystal display panels. In an existing production process, five photomask processes are generally needed during an etching process. A greater number of photomask processes lead to a complicated production process, while production cost is also higher.

Therefore, it is necessary to come up with a solution to a problem in the prior art.

SUMMARY

In order to solve a problem above, an embodiment of the present disclosure provides a manufacturing method of a display panel and the display panel to solve the problem that photomask processes are more in a photomask manufacturing process and a high production cost of the display panel in an existing display panel manufacturing process.

To solve the problem above, the present disclosure provides technical solutions as follows:

According to a first aspect in an embodiment of the present disclosure, a manufacturing method of the display panel including a display area and a non-display are is provided, and the manufacturing method includes following steps:

S100, manufacturing a first metal layer on a base substrate, and performing a patterning process on the first metal layer to form a first electrode, a gate electrode and a second electrode disposed at an interval, wherein the first electrode is disposed in the non-display area, and the gate electrode and the second electrode are disposed in the display area.

S101, depositing an insulation layer and an active layer on the base substrate, and performing a patterning process on the insulation layer and the active layer to form a first hole and a second hole, wherein the first hole penetrates the insulation layer and the active layer to expose the first electrode, and the second hole penetrates the insulation layer and the active layer to expose the second electrode.

S102, depositing a second metal layer on the base substrate, and performing a patterning process on the second metal layer to form a source electrode, a drain electrode, a third electrode and a fourth electrode, wherein the source electrode and the drain electrode are disposed on the gate electrode, and the third electrode is connected to the first electrode by the first hole, and the fourth electrode is connected to the second electrode by the second hole.

S103, depositing a passivation layer on the base substrate, and performing a patterning process on the passivation layer to form a third hole and a fourth hole, wherein the third hole penetrates the passivation layer to expose the third electrode, and the fourth hole penetrates the passivation layer to expose the fourth electrode.

S104, making the third electrode corresponding to the third hole and the fourth electrode corresponding to the fourth hole undergo a reduction reaction by introducing reducing substances at a high temperature, and forming a third metal layer on a surface of the third electrode and the fourth electrode, wherein the reducing substances include reducing gases or reducing liquids, and materials of the third electrode and the fourth electrode include cupric oxide (CuO).

According to an embodiment of the present disclosure, the reducing gases include carbon monoxide (CO) and hydrogen ($H_2$).

According to an embodiment of the present disclosure, the base substrate is heated, and the reducing gases are introduced at a temperature of 100 degrees Celsius (° C.) to 210° C. and heated.

According to an embodiment of the present disclosure, in the step of S104, the reducing liquids include ethyl alcohol.

According to an embodiment of the present disclosure, the third electrode and the fourth electrode of the display panel are heated to 200° C., and the ethyl alcohol is coated on the surface of the third electrode and the fourth electrode.

According to an embodiment of the present disclosure, the third electrode and the fourth electrode of the display panel are heated to 200° C., and the ethyl alcohol is coated on the surface of the third electrode and the fourth electrode.

According to an embodiment of the present disclosure, a step further included: bonding a peripheral line of the display panel with the third electrode corresponding to the third hole.

According to a second aspect in an embodiment of the present disclosure, a manufacturing method of the display panel including a display area and a non-display are is provided, and the manufacturing method includes following steps:

S100, manufacturing a first metal layer on a base substrate, and performing a patterning process on the first metal layer to form a first electrode, a gate electrode and a second electrode disposed at an interval, wherein the first electrode is disposed in the non-display area, and the gate electrode and the second electrode are disposed in the display area.

S101, depositing an insulation layer and an active layer on the base substrate, and performing a patterning process on the insulation layer and the active layer to form a first hole and a second hole, wherein the first hole penetrates the insulation layer and the active layer to expose the first electrode, and the second hole penetrates the insulation layer and the active layer to expose the second electrode.

S102, depositing a second metal layer on the base substrate, and performing a patterning process on the second metal layer to form a source electrode, a drain electrode, a third electrode and a fourth electrode, wherein the source electrode and the drain electrode are disposed on the gate electrode, and the third electrode is connected to the first electrode by the first hole, and the fourth electrode is connected to the second electrode by the second hole.

S103, depositing a passivation layer on the base substrate, and performing a patterning process on the passivation layer to form a third hole and a fourth hole, wherein the third hole penetrates the passivation layer to expose the third electrode, and the fourth hole penetrates the passivation layer to expose the fourth electrode.

S104, making the third electrode corresponding to the third hole and the fourth electrode corresponding to the fourth hole undergo a reduction reaction by introducing reducing substances at a high temperature, and forming a third metal layer on a surface of the third electrode and the fourth electrode.

According to an embodiment of the present disclosure, the reducing gases include carbon monoxide (CO) and hydrogen ($H_2$).

According to an embodiment of the present disclosure, the base substrate is heated, and the reducing gases are introduced at a temperature of 100° C. to 210° C. and heated.

According to an embodiment of the present disclosure, in the step of S104, the reducing substances includes reducing liquids, and the reducing liquids include ethyl alcohol.

According to an embodiment of the present disclosure, the ethyl alcohol is coated on a surface of the third electrode corresponding to the third hole and the fourth electrode corresponding to the fourth hole at a temperature of 200° C.

According to an embodiment of the present disclosure, the third electrode and the fourth electrode of the display panel are heated to 200° C., and the ethyl alcohol is coated on the surface of the third electrode and the fourth electrode.

According to an embodiment of the present disclosure, a step further included: bonding a peripheral line of the display panel with the third electrode corresponding to the third hole.

According to an embodiment of the present disclosure, in the step of S104, materials of the third electrode and the fourth electrode include cupric oxide (CuO), and the CuO and the reducing substance undergo a reduction reaction to form the third metal layer including copper (Cu).

According to a third aspect in an embodiment of the present disclosure, a manufacturing method of the display panel including a display area and a non-display are is provided, the display panel including: a base substrate; a first metal layer disposed on the base substrate; an insulation layer disposed on the base substrate; an active layer disposed on the insulation layer; a second metal layer disposed on the active layer; and a passivation layer disposed on the second metal layer.

Wherein the display panel further includes a first hole and a third hole defined on the non-display area, and a second hole and a fourth hole defined on the display area, wherein the first metal layer includes a first electrode and a second electrode, wherein the second metal layer includes a third electrode and a fourth electrode, wherein the first electrode is connected to the third electrode by the first hole, wherein the second electrode is connected to the fourth electrode by the second hole, and the third metal layer is disposed on a surface of the third electrode corresponding to the third hole and the fourth electrode corresponding to the fourth hole.

According to an embodiment of the present disclosure, materials of the third metal layer includes copper.

According to an embodiment of the present disclosure, materials of the third electrode and the fourth electrode include cupric oxide.

According to an embodiment of the present disclosure, materials of the third electrode and the fourth electrode include cupric oxide (CuO), or a composite material of molybdenum (Mo) and copper (Cu).

According to an embodiment of the present disclosure, materials of the insulation layer include silicon nitride ($SiN_x$).

In summary, beneficial effects in an embodiment of the present disclosure are:

An embodiment of the present disclosure provides the manufacturing of the display panel and the display panel. Hole structures are disposed in the passivation layer, and the base substrate of the display panel is under a heat treatment at a high temperature. The reducing substances are introduced during the heat treatment to achieve a reduction reaction of the second metal layer corresponding to the hole structures, and to reduce metal oxides to form metal element material. Further, the metal element material is formed on a surface of the second metal layer. The peripheral line can be directly connected to the metal element material when bonding, thereby improving a contact effect between lines, reducing a number of photomasks in a preparation process of the display panel, simplifying a production process flow, and reducing cost.

DETAILED DESCRIPTION OF PREFERRED EMBODIMENTS

The following description of the various embodiments referring with additional diagram is provided to illustrate particular embodiments that may be implemented in accordance with the present disclosure.

A display panel needs to be processed by a plurality of photomasks during manufacturing. The greater number of times the photomask is processed, the greater an impact on each film layer of the display panel. At the same time, the greater number of photomask processes further increase manufacturing cost of the display panel. In the existing manufacturing technology, the display panel generally needs five photomask etching processes, making the manufacturing process complicated, and is not conducive to an overall performance improvement of the display panel.

Figure 1:
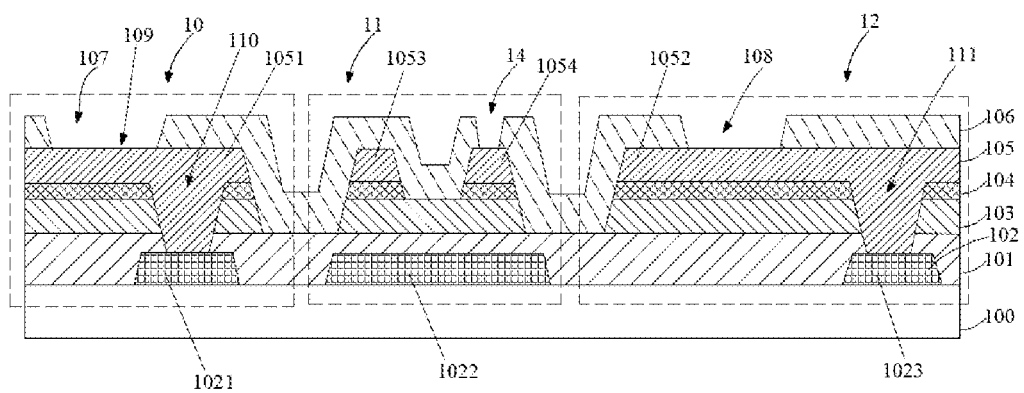
FIG. 1 is a structural diagram of a film layer structure of a display panel according to an embodiment of the present disclosure.

As shown in FIG. 1, FIG. 1 is a structural diagram of a film layer structure of a display panel according to an embodiment of the present disclosure. According to the embodiment of the present disclosure, the display panel includes a display area and a non-display area adjacent to the display area. Specifically, the non-display area includes a first bonding area 10. The display area includes a thin-film transistor area 11, and a second bonding area 12. The first bonding area 10 is adjacent to the thin-film transistor area 11, and the second bonding area 12 is adjacent to the thin-film transistor area 11.

Wherein, the first bonding area 10 can be a border area of the display panel. A metal layer disposed in the bonding area 10 of the display panel is electrically connected to a chip on film. A plurality of thin-film transistors are disposed in the thin-film transistor area 11, which can be a main display area of the display panel.

Further, the display panel further includes a base substrate 100, an insulation layer 101, a first metal layer 102, and an active layer 103. Wherein, the insulation layer 101 is disposed on the base substrate 100, the first metal layer 102 is disposed on the base substrate 100, and the insulation layer 101 completely covers the first metal layer 102. The active layer 103 is disposed on the insulation layer 101.

Specifically, according to an embodiment of the present disclosure, the first metal layer 102 further includes a first electrode 1021, a gate electrode 1022 of a thin-film transistor, and a second electrode 1023. Wherein, the first electrode 1021 is disposed in the non-display area of the display panel. The gate electrode 1022 and the second electrode 1023 are disposed in the display area of the display panel, and the first electrode 1021, the gate electrode 1022, and the second electrode 1023 can be disposed on a same layer of the display panel and can be disposed at an interval.

At the same time, the display panel according to an embodiment of the disclosure further includes a second metal layer 105 and a passivation layer 106. The second metal layer 105 can be disposed on the active layer 103. The passivation layer 106 is disposed on the second metal layer 105. According to an embodiment of the disclosure, the second metal layer 105 is disposed on a position corresponding to the first metal layer 102. And film layers disposed between the first metal layer 102 and the second metal layer 105 disposed on corresponding areas of the first bonding area 10 and the second bonding area 12 are provided with holes. The first metal layer 102 is connected to the second metal layer 105 by the holes.

Further, the second metal layer 105 includes a third electrode 1051, a fourth electrode 1052, and a source electrode 1053 and a drain electrode 1054 of the thin-film transistor. The third electrode 1051 is correspondingly disposed on the first electrode 1021 and is electrically connected to the first electrode 1021 by a first hole 110 defined on the first electrode 1021. The fourth electrode 1052 is correspondingly disposed on the second electrode 1023 and is connected to the second electrode 1023 by a second hole 111 defined on the second electrode 1023. The source electrode 1053 and the drain electrode 1054 of the thin-film transistor are correspondingly disposed on the gate electrode 1022.

Wherein, the first metal layer 102 and the second metal layer 105 can be made of same materials, preferably cupric oxide (CuO) or a composite material of molybdenum (Mo) and copper (Cu).

In an embodiment of the present disclosure, the display panel can further include a doped layer 104. The doped layer 104 is disposed on the active layer 103, and the second metal layer 105 is disposed on the doped layer 104.

Further, the passivation layer 106 further includes a plurality of hole structures including a third hole 107 and a fourth hole 108 according to an embodiment of the disclosure. The third hole 107 is defined on the third electrode 1051 corresponding to the second metal layer 105 in the first bonding area 10. The fourth hole 108 is defined on the fourth electrode 1052 corresponding to the second metal layer 105 in the second bonding area 12.

According to an embodiment of the present disclosure, materials of the insulation layer 101 and the passivation layer 106 can include insulating materials such as silicon nitride ($SiN_x$). And materials of the active layer 103 can be amorphous silicon (a-Si) or oxide semiconductor material such as indium gallium zinc oxide (IGZO). At the same time, the passivation layer 106 corresponding to the thin-film transistor area 11 further includes a fifth hole 14. The fifth hole 14 penetrates the passivation layer 106 to expose the drain electrode 1054 of the thin-film transistor.

Preferably, according to an embodiment of the disclosure, materials of an upper surface area 109 of the third electrode 1051 and the fourth electrode 1052 of the second metal layer 105 corresponding to the third hole 107 and the fourth hole 108 are materials of a third metal layer. Specifically, materials of the third metal layer include a single metal material. Therefore, when bonding the display panel, peripheral lines can be electrically connected to the third electrode 1051 corresponding to the second metal layer 105 directly, thereby eliminating a process of separately manufacturing an indium tin oxide film on the second metal layer 105 during a traditional manufacturing process, and effectively simplifying a film layer structure of the display panel. At the same time, since there is no need to provide the indium tin oxide film, the photomask process when preparing the indium tin oxide film layer is omitted, thereby simplifying a production process of the display panel.

According to an embodiment of the present disclosure, the upper surface area 109 of the third electrode 1051 corresponding to the third hole 107 and the fourth electrode 1052 corresponding to the fourth hole 108 under a reduction process can directly obtain copper (Cu) in a manufacturing process, when material of the second metal layer 105 preferably includes cupric oxide (CuO). A thickness of a metal Cu layer can be set according to a specific requirement of an actual product.

Figure 2:
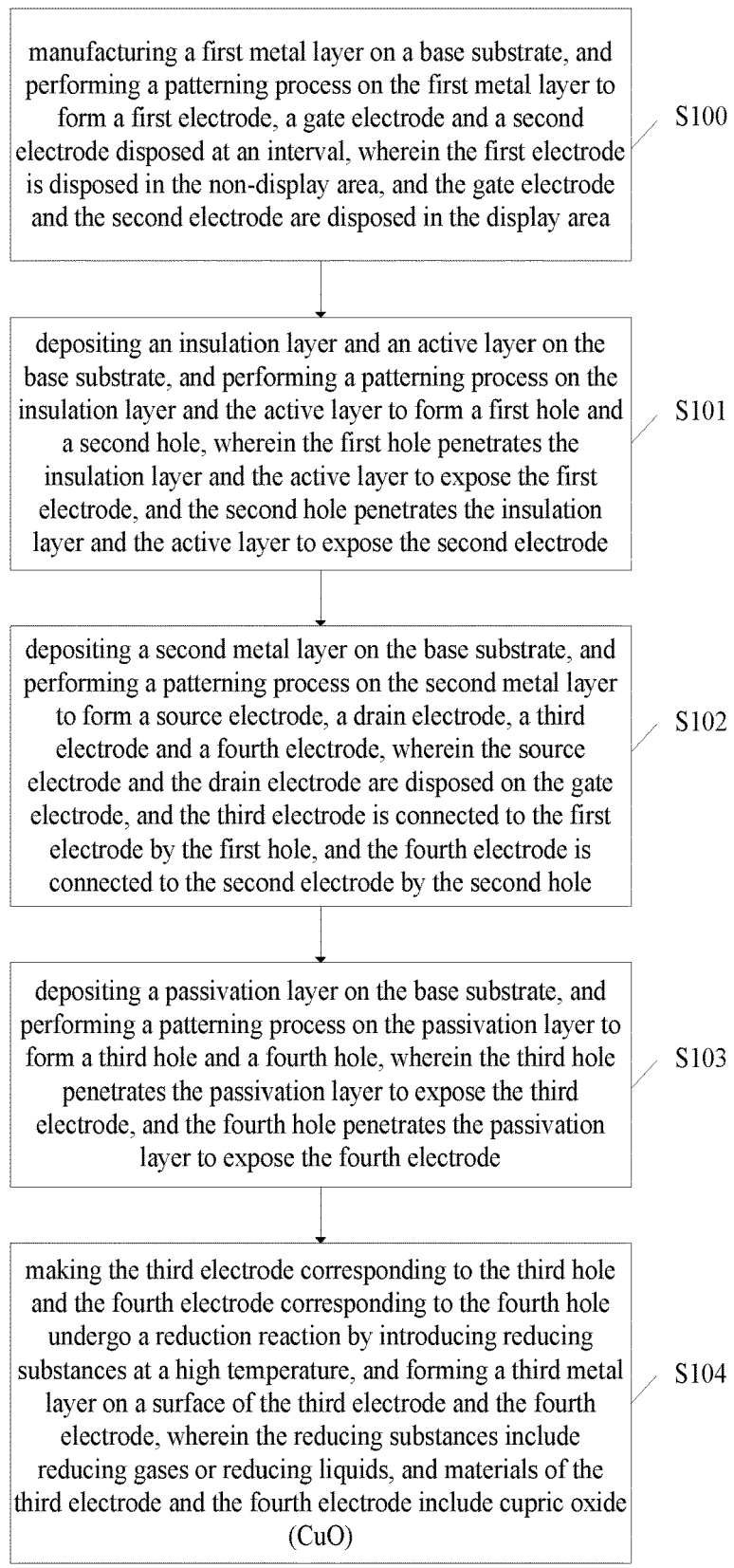
FIG. 2 is a schematic diagram of a manufacturing process of the display panel according to an embodiment of the present disclosure.

Further, the present disclosure further provides a manufacturing method of the display panel. As shown in FIG. 2, FIG. 2 is a schematic diagram of a manufacturing process of the display panel according to an embodiment of the present disclosure. The manufacturing method of the display panel includes steps as follow:

S100, manufacturing a first metal layer on a base substrate, and performing a patterning process on the first metal layer to form a first electrode, a gate electrode, and a second electrode disposed at an interval, wherein the first electrode is disposed in the non-display area, and the gate electrode and the second electrode are disposed in the display area.

Figure 3:
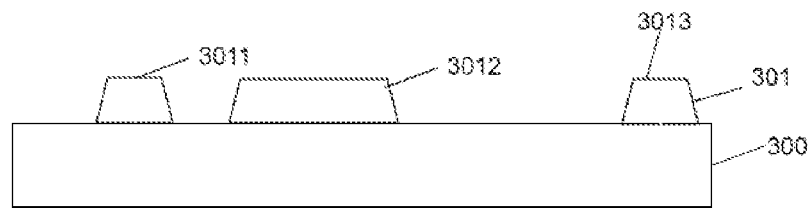
FIG. 3 to FIG. 6 are structural diagrams of each film layer structure corresponding to the manufacturing process of the display panel according to an embodiment of the present disclosure.

As shown in FIG. 3, FIG. 3 is another structural diagram of each film layer structure corresponding to the manufacturing process of the display panel according to an embodiment of the present disclosure. A first metal layer 301 is disposed on the base substrate 300. After the first metal layer 301 is deposited, the first metal layer 301 is patterned by a first photomask to form the film layer structure shown in FIG. 3.

After etching is completed, the first metal layer 301 is configured to form a first electrode 3011, a gate electrode 3012 of a thin-film transistor, and a second electrode 3013. Wherein the first electrode 3011, the gate electrode 3012, and the second electrode 3013 are disposed in a same layer.

S101, depositing an insulation layer and an active layer on the base substrate, and performing a patterning process on the insulation layer and the active layer to form a first hole and a second hole, wherein the first hole penetrates the insulation layer and the active layer to expose the first electrode, and the second hole penetrates the insulation layer and the active layer to expose the second electrode.

Figure 4:
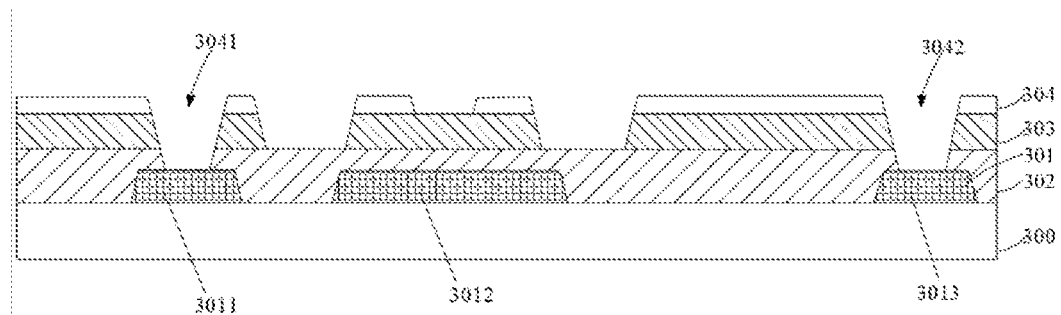

As shown in FIG. 4, FIG. 4 is another structural diagram of each film layer structure corresponding to the manufacturing process of the display panel according to an embodiment of the present disclosure. An insulation layer 302 is continuously deposited on a base substrate 300, after a first metal layer 301 is etched. Wherein the insulation layer 302 completely covers the first metal layer 301. At the same time, an active layer 303 and a doped layer 304 are disposed on the insulation layer 302, and the doped layer 304 is disposed on the active layer 303.

A mask is disposed on a corresponding position of the first metal layer 301 to photoetch the first metal layer 301 by a second photomask, after the above film layers are prepared. Structures of a first hole 3041 and a second hole 3042 are formed after etching. The first hole 3041 and the second hole 3042 penetrate the insulation layer 302, the active layer 303, and the doped layer 304, and expose part of the first electrode 3011 and part of the second electrode 3013, respectively.

A physical vapor deposition process can be adopted when depositing each of the film layer structures above. A deposition thickness of each of the film layers can be set according to requirements of an actual product, and is not described in detail here.

S102, depositing a second metal layer on the base substrate, and performing a patterning process on the second metal layer to form a source electrode, a drain electrode, a third electrode, and a fourth electrode, wherein the source electrode and the drain electrode are disposed on the gate electrode, and the third electrode is connected to the first electrode by the first hole, and the fourth electrode is connected to the second electrode by the second hole.

Figure 5:
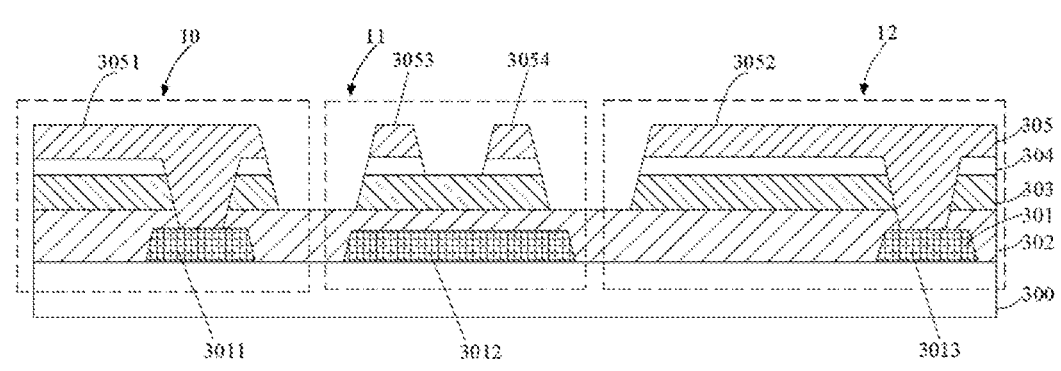

As shown in FIG. 5, FIG. 5 is another structural diagram of each film layer structure corresponding to the manufacturing process of the display panel according to an embodiment of the present disclosure. Depositing a second metal layer 305 on the doped layer 304, after a process of each of the film layers in step S101 is completed. When the second metal layer 305 is deposited, it can be prepared by the physical vapor deposition process. At the same time, the second metal layer 305 is connected to the first metal layer 301 by the first hole and the second hole.

According to an embodiment, the display panel further includes the first bonding area 10, the thin-film transistor area 11, and the second bonding area 12, which are disposed adjacently in sequence. A third mask is adopted for processing, after the second metal layer 305 is deposited.

Specifically, the third mask is adopted for processing, and a metal mask is disposed on a corresponding position of the second metal layer 305 to etch. After an etching process is completed, a third electrode 3051, a fourth electrode 3052, and a source electrode 3053 and a drain electrode 3054 of a thin-film transistor are formed corresponding to the second metal layer 305. The source electrode 3053 and the drain electrode 3054 of the thin-film transistor are disposed on an upper area of the gate electrode 3012. At the same time, the third electrode 3051 is electrically connected to the first electrode 3011 by the first hole, and the fourth electrode 3052 is electrically connected to the second electrode 3013 by the second hole. During the etching process, the film layer in different areas can be etched with different light intensity as required. A plurality of hole structures with different depths are further formed in the display panel after a processing is completed.

Preferably, a depth of holes defined in adjacent areas between the first bonding area 10, the thin-film transistor area 11, and the second bonding area is greater than a depth of holes defined in other areas. Wherein, the holes defined in the adjacent area are etched to the insulation layer 302, while corresponding holes defined in the thin-film transistor area 11 only need to be etched to the active layer 303.

S103, depositing a passivation layer on the base substrate, and performing a patterning process on the passivation layer to form a third hole and a fourth hole, wherein the third hole penetrates the passivation layer to expose the third electrode, and the fourth hole penetrates the passivation layer to expose the fourth electrode.

Figure 6:
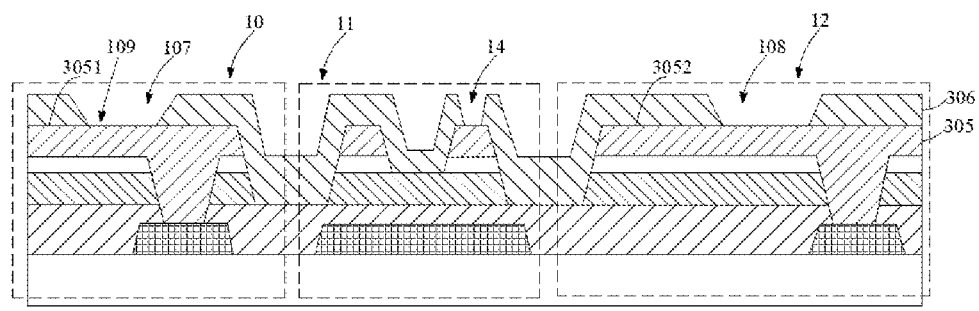

As shown in FIG. 6, FIG. 6 is another structural diagram of each film layer structure corresponding to the manufacturing process of the display panel according to an embodiment of the present disclosure. A passivation layer 306 is disposed on the second metal layer 305, after etching the second metal layer 305, and the passivation layer 306 can be prepared by the physical vapor deposition process.

After the passivation layer 306 is prepared, the fourth mask is adopted for processing, and a metal mask is disposed on a corresponding position of the passivation layer 306 to etch. During the etching process, the film layer in different areas can be etched with different light intensity as required. After etching is completed, the third hole 107 is formed in the first bonding area 10 of the display panel, and the third hole 107 is defined on a corresponding position of the third electrode 3051. The fourth hole 108 is formed in the second bonding area 12 of the display panel, and the fourth hole 108 is defined on a corresponding position of the fourth electrode 3052. At the same time, the fifth hole 14 is formed by etching in a corresponding position of the drain electrode of the thin-film transistor. A depth and an aperture size of the third hole 107 and the fourth hole 108 can be the same to simplify a manufacturing process of the mask and to improve an etching efficiency.

At the same time, different hole structures disposed in the other areas of the display panel can be specifically set according to usage requirements, as other hole structures shown in FIG. 6.

S104, making the third electrode corresponding to the third hole and the fourth electrode corresponding to the fourth hole undergo a reduction reaction by introducing reducing substances at a high temperature, and forming a third metal layer on a surface of the third electrode and the fourth electrode.

A structure required in an embodiment of the present disclosure is obtained after four photomask etchings above, and continue to process the display panel corresponding to FIG. 6.

Figure 7:
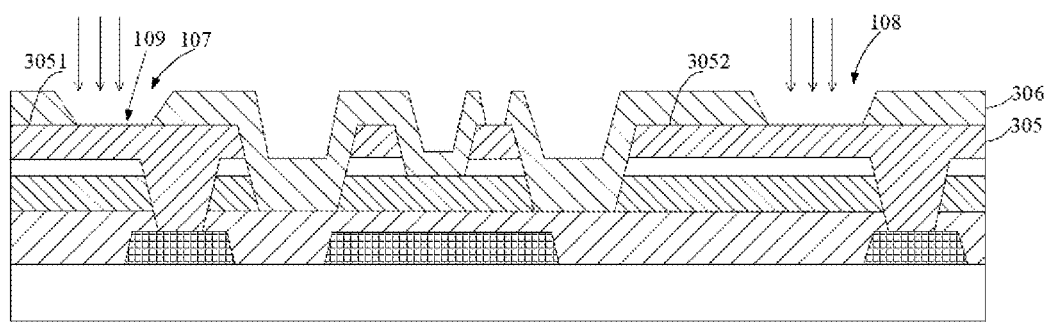
FIG. 7 is a schematic diagram of a process procedure of the display panel according to an embodiment of the present disclosure.

Specifically, as shown in FIG. 7, FIG. 7 is a schematic diagram of a process procedure of the display panel according to an embodiment of the present disclosure. Continue to process each of the film layers after a preparation of the passivation layer 306 is completed. In an embodiment of the present disclosure, the third electrode 3051 and the fourth electrode 3052 of the second metal layer 305 corresponding to the third hole 107 and the fourth hole 108 of the display panel are mainly processed. The reducing substances are introduced to form the third metal layer on the upper surface area 109 of the third electrode 3051 and the fourth electrode 3052.

At this time, reducing gases are introduced in areas corresponding to the third hole 107 and the fourth hole 108 in a high temperature environment. Preferably, in an embodiment of the present disclosure, materials of the third electrode 3051 and the fourth electrode 3052 of the second metal layer 305 are conductive oxide materials such as cupric oxide (CuO), molybdenum (Mo), or copper (Cu). The reducing gases introduced include carbon monoxide (CO) gas, hydrogen ($H_2$) gas, or other reducing gases.

When the reducing gas introduced is the CO, the base substrate is heated at a heating temperature of 100 degrees Celsius (° C.) to 210° C. In an embodiment of the present disclosure, the heating temperature is preferably 200° C. The CO gas is introduced on an upper surface of the third electrode 3051 and the fourth electrode 3052 corresponding to the second metal layer 305 after the base substrate is heated to a set temperature. The CuO on the upper surface area 109 of the second metal layer 305 is reduced in the high temperature environment. A specific reducing reaction formula is $CuO+CO=Cu+CO_2$. The CuO is reduced to form the Cu. At this time, a material of the third metal layer is the Cu. The $CO_2$ formed is directly volatilized, and does not become a residue in the film layer of the display panel. In addition, a thickness of a metal Cu layer formed can be set according to product requirements. A flow rate of introduced gas is increased and a reaction time between the CuO and the CO is increased if a required thickness of the metal Cu layer is thicker.

When the reducing gas introduced is the $H_2$, similarly, the base substrate is heated at a heating temperature of 100° C. to 210° C. In an embodiment of the present disclosure, the heating temperature is preferably 200° C. Then, introducing the $H_2$ into an opening area. At this time, CuO is reduced to form Cu. A specific reducing reaction formula is $CuO+H_2=Cu+H_2O$. The $H_2$ formed is directly volatilized, and does not become a residue in the high temperature environment.

Further, when the reducing substance introduced is reducing liquid, preferably, the reducing liquid is ethyl alcohol. In a process of introducing the ethyl alcohol, a treatment is performed at a high temperature, and ethyl alcohol liquid is uniformly coated on the upper surface area 109 of the third electrode 3051 and the fourth electrode 3052 corresponding to the second metal layer 305. Preferably, a treatment temperature is 200° C. Alternatively, when the ethyl alcohol liquid is coated, the third electrode 3051 and the fourth electrode 3051 corresponding to the display panel are heated to 200° C. at first, and then the ethyl alcohol liquid is quickly coated on the upper surface area 109 to achieve a reaction. At this time, surface material of the second metal layer 305 is reduced. Specifically, $CH_3CH_2OH$ (the ethyl alcohol)+$CuO=CH_3CHO+H_2O+Cu$. The $CH_3CHO$ and the $H_2O$ are directly volatilized at the high temperature environment, and do not affect the film layers of the display panel and a performance of the display panel.

Preferably, an embodiment of the present disclosure can further includes a step of S105.

S105, bonding a peripheral line of the display panel with the third electrode corresponding to the third hole.

Finally, the display panel according to an embodiment of the present disclosure is manufactured. Since the material of the third metal layer formed on the surface of the second metal layer 305 corresponding to the hole structure is metallic Cu having good electrical and thermal conductivity properties, a bonding effect between the peripheral line and the second metal layer is good and a bonding process is easy, when bonding the peripheral line with the second metal layer corresponding to the hole structure. Thus, the peripheral line can be directly connected to the third electrode corresponding to the second metal layer to realize that an indium tin oxide film configured for a transition connection and separately disposed on the third electrode corresponding to the second metal layer is eliminated, thereby achieving a purpose of simplifying the production process and reducing a production cost.

The manufacturing method of the display panel and the display panel provided by the embodiments of the present disclosure are described in detail above. The description of the above embodiments is only for helping to understand the technical solutions of the present disclosure and its core ideas. It should be understood by those skilled in the art that the technical solutions described in the foregoing embodiments may be modified, and the modifications or substitutions do not deviate from the technical solutions of the embodiments of the present disclosure.

What is claimed is:

1. A manufacturing method of a display panel, wherein the display panel comprises a display area and a non-display area, the manufacturing method comprising steps of:
    S100, manufacturing a first metal layer on a base substrate, and performing a patterning process on the first metal layer to form a first electrode, a gate electrode, and a second electrode disposed at an interval, wherein the first electrode is disposed in the non-display area, and the gate electrode and the second electrode are disposed in the display area;
    S101, depositing an insulation layer and an active layer on the base substrate, and performing a patterning process on the insulation layer and the active layer to form a first hole and a second hole, wherein the first hole penetrates the insulation layer and the active layer to expose the first electrode, and the second hole penetrates the insulation layer and the active layer to expose the second electrode;
    S102, depositing a second metal layer on the base substrate, and performing a patterning process on the second metal layer to form a source electrode, a drain electrode, a third electrode, and a fourth electrode, wherein the source electrode and the drain electrode are disposed on the gate electrode, and the third electrode is connected to the first electrode by the first hole, and the fourth electrode is connected to the second electrode by the second hole;
    S103, depositing a passivation layer on the base substrate, and performing a patterning process on the passivation layer to form a third hole and a fourth hole, wherein the third hole penetrates the passivation layer to expose the third electrode, and the fourth hole penetrates the passivation layer to expose the fourth electrode;
    S104, making the third electrode corresponding to the third hole and the fourth electrode corresponding to the fourth hole undergo a reduction reaction by introducing reducing substances at a high temperature, and forming a third metal layer on a surface of the third electrode and the fourth electrode, wherein the reducing substances comprise reducing gases or reducing liquids, and materials of the third electrode and the fourth electrode comprise cupric oxide (CuO).

2. The manufacturing method of the display panel as claimed in claim 1, wherein the reducing gases comprise carbon monoxide (CO) and hydrogen ($H_2$).

3. The manufacturing method of the display panel as claimed in claim 1, wherein the base substrate is heated, and the reducing gases are introduced at a temperature of 100 degrees Celsius (° C.) to 210° C. and heated.

4. The manufacturing method of the display panel as claimed in claim 1, wherein the reducing liquids comprise ethyl alcohol.

5. The manufacturing method of the display panel as claimed in claim 4, wherein the ethyl alcohol is coated on a surface of the third electrode corresponding to the third hole and the fourth electrode corresponding to the fourth hole at a temperature of 200° C.

6. The manufacturing method of the display panel as claimed in claim 4, wherein the third electrode and the fourth electrode of the display panel are heated to 200° C., and the ethyl alcohol is coated on the surface of the third electrode and the fourth electrode.

7. The manufacturing method of the display panel as claimed in claim 1, further comprising a step of bonding a peripheral line of the display panel with the third electrode corresponding to the third hole.

8. A display panel manufactured by a manufacturing method as claimed in claim 1, comprising:
the base substrate;
the first metal layer disposed on the base substrate;
the insulation layer disposed on the base substrate;
the active layer disposed on the insulation layer;
the second metal layer disposed on the active layer;
and the passivation layer disposed on the second metal layer;
wherein the display panel further comprises the first hole and the third hole defined on the non-display area and the second hole and the fourth hole defined on the display area, the first metal layer comprises the first electrode and the second electrode, the second metal layer comprises the third electrode and the fourth electrode, the first electrode is connected to the third electrode by the first hole, the second electrode is connected to the fourth electrode by the second hole, and the third metal layer is disposed on the surface of the third electrode corresponding to the third hole and the fourth electrode corresponding to the fourth hole.

9. The display panel as claimed in claim 8, wherein materials of the third metal layer comprise copper (Cu).

10. The display panel as claimed in claim 8, wherein materials of the third electrode and the fourth electrode comprise cupric oxide (CuO).

11. The display panel as claimed in claim 8, wherein materials of the third electrode and the fourth electrode comprise cupric oxide (CuO), or a composite material of molybdenum (Mo) and copper (Cu).

12. The display panel as claimed in claim 8, wherein materials of the insulation layer comprise silicon nitride ($SiN_x$).

13. A manufacturing method of a display panel, wherein the display panel comprises a display area and a non-display area, comprising steps of:
S100, manufacturing a first metal layer on a base substrate, and performing a patterning process on the first metal layer to form a first electrode, a gate electrode, and a second electrode disposed at an interval, wherein the first electrode is disposed in the non-display area, and the gate electrode and the second electrode are disposed in the display area;

S101, depositing an insulation layer and an active layer on the base substrate, and performing a patterning process on the insulation layer and the active layer to form a first hole and a second hole, wherein the first hole penetrates the insulation layer and the active layer to expose the first electrode, and the second hole penetrates the insulation layer and the active layer to expose the second electrode;

S102, depositing a second metal layer on the base substrate, and performing a patterning process on the second metal layer to form a source electrode, a drain electrode, a third electrode, and a fourth electrode, wherein the source electrode and the drain electrode are disposed on the gate electrode, and the third electrode is connected to the first electrode by the first hole, and the fourth electrode is connected to the second electrode by the second hole;

S103, depositing a passivation layer on the base substrate, and performing a patterning process on the passivation layer to form a third hole and a fourth hole, wherein the third hole penetrates the passivation layer to expose the third electrode, and the fourth hole penetrates the passivation layer to expose the fourth electrode;

S104, making the third electrode corresponding to the third hole and the fourth electrode corresponding to the fourth hole undergo a reduction reaction by introducing reducing substances at a high temperature, and forming a third metal layer on a surface of the third electrode and the fourth electrode.

14. The manufacturing method of the display panel as claimed in claim 13, wherein the reducing gases comprise carbon monoxide (CO) and hydrogen ($H_2$).

15. The manufacturing method of the display panel as claimed in claim 14, wherein the base substrate is heated, and the reducing gases are introduced at a temperature of 100° C. to 210° C. and heated.

16. The manufacturing method of the display panel as claimed in claim 13, wherein in the step of S104, the reducing substances comprise reducing liquids, and the reducing liquids comprise ethyl alcohol.

17. The manufacturing method of the display panel as claimed in claim 16, wherein the ethyl alcohol is coated on a surface of the third electrode corresponding to the third hole and the fourth electrode corresponding to the fourth hole at a temperature of 200° C.

18. The manufacturing method of the display panel as claimed in claim 16, wherein the third electrode and the fourth electrode of the display panel are heated to 200° C., and the ethyl alcohol is coated on the surface of the third electrode and the fourth electrode.

19. The manufacturing method of the display panel as claimed in claim 13, comprising a step of bonding a peripheral line of the display panel with the third electrode corresponding to the third hole.

20. The manufacturing method of the display panel as claimed in claim 13, wherein in the step of S104, materials of the third electrode and the fourth electrode comprise cupric oxide (CuO), and the CuO and the reducing substances undergo a reduction reaction to form the third metal layer comprising copper (Cu).

* * * * *